United States Patent
Jongman et al.

(10) Patent No.: US 10,325,985 B2
(45) Date of Patent: Jun. 18, 2019

(54) PROTECTING TRANSISTOR ELEMENTS AGAINST DEGRADING SPECIES

(71) Applicant: FLEXENABLE LIMITED, Cambridge (GB)

(72) Inventors: Jan Jongman, Cambridgeshire (GB); Anja Wellner, Dresden (DE); Jens Dienelt, Radebeul (DE); Karsten Neumann, Dresden (DE); Stephan Riedel, Dresden (DE)

(73) Assignee: FLEXENABLE LIMITED, Cambridge (GB)

( * ) Notice: Subject to any disclaimer, the term of this patent is extended or adjusted under 35 U.S.C. 154(b) by 19 days.

(21) Appl. No.: 15/327,263

(22) PCT Filed: Jul. 21, 2015

(86) PCT No.: PCT/EP2015/066684
§ 371 (c)(1),
(2) Date: Jan. 18, 2017

(87) PCT Pub. No.: WO2016/012466
PCT Pub. Date: Jan. 28, 2016

(65) Prior Publication Data
US 2017/0179231 A1    Jun. 22, 2017

(30) Foreign Application Priority Data
Jul. 22, 2014 (GB) .................................. 1412974.6

(51) Int. Cl.
*H01L 29/10*     (2006.01)
*H01L 27/32*     (2006.01)
(Continued)

(52) U.S. Cl.
CPC ...... *H01L 29/1054* (2013.01); *H01L 27/3237* (2013.01); *H01L 27/3248* (2013.01);
(Continued)

(58) Field of Classification Search
CPC ............ H01L 27/124; H01L 27/14603; H01L 27/14609; H01L 27/1463; H01L 27/3248;
(Continued)

(56) References Cited

U.S. PATENT DOCUMENTS 6,894,747 B2 * 5/2005 Okumura .......... G02F 1/133553
349/113
8,860,303 B2 * 10/2014 Kim .................... H01L 27/3246
313/504

(Continued)

*Primary Examiner* — Jose R Diaz
(74) *Attorney, Agent, or Firm* — Sughrue Mion, PLLC

(57) ABSTRACT

A technique comprising: providing a stack of layers defining at least (a) source and drain electrodes, (b) gate electrode, and (c) semiconductor channel of at least one transistor; depositing one or more organic insulating layers over the stack; removing at least part of the stack in one or more selected regions by an ablation technique; depositing conductor material over the stack in at least the one or more ablated regions and one or more border regions immediately surrounding a respective ablated region; and depositing inorganic insulating material over the stack at least in the ablated regions and the border regions to cover the ablated regions and make direct contact with said conductor material in said one or more border regions all around the respective ablated region.

20 Claims, 4 Drawing Sheets

(51) Int. Cl.
  *H01L 51/05* (2006.01)
  *H01L 51/00* (2006.01)
(52) U.S. Cl.
  CPC ...... *H01L 27/3258* (2013.01); *H01L 27/3262* (2013.01); *H01L 27/3272* (2013.01); *H01L 27/3274* (2013.01); *H01L 51/0533* (2013.01); *H01L 51/0014* (2013.01); *H01L 51/052* (2013.01)
(58) Field of Classification Search
  CPC ............... H01L 27/326; H01L 27/3258; H01L 27/0733; H01L 27/0727; H01L 51/5212; H01L 51/5209; H01L 23/5223; H01L 29/1054
  See application file for complete search history.

(56) References Cited

U.S. PATENT DOCUMENTS

| | | | |
|---|---|---|---|
| 9,219,081 B2* | 12/2015 | Nagasawa | H01L 27/124 |
| 2005/0285100 A1 | 12/2005 | Jeong et al. | |
| 2013/0126915 A1* | 5/2013 | Chan | H01L 51/5253 257/88 |
| 2014/0175442 A1 | 6/2014 | Kwack et al. | |

* cited by examiner

PROTECTING TRANSISTOR ELEMENTS AGAINST DEGRADING SPECIES

CROSS REFERENCE TO RELATED APPLICATIONS

This application is a National Stage of International Application No. PCT/EP2015/066684 filed Jul. 21, 2015, claiming priority based on British Patent Application No. 1412974.6, filed Jul. 22, 2014, the contents of all of which are incorporated herein by reference in their entirety.

It has been found that the performance of some transistors can be degraded by species migrating from other parts of the device in which the transistor is incorporated. For example, some adhesives used to securely laminate a control component including one or more transistors to another component such as an optical media component to be controlled by the control component have been found to be a source of degrading chemical species. For the example of transistor arrays used to control the output of an optical medium in a display device, degradation of transistor arrays in display devices can be manifested by blackening of the display image. Similar blackening of the display image loss of function can be observed in other types of devices incorporating transistor arrays such as sensors.

The inventors for the present application have identified the challenge of effectively protecting transistors from degrading chemical species, particularly when, for example, the output conductors of the transistors need to provide an ohmic contact to an external element (such as, for example, an optical medium to be controlled by the transistors).

There is hereby provided a method comprising: providing a stack of layers defining at least (a) source and drain electrodes, (b) gate electrode, and (c) semiconductor channel of at least one transistor; depositing one or more organic insulating layers over the stack; removing at least part of the stack in one or more selected regions by an ablation technique; depositing conductor material over the stack in at least the one or more ablated regions and one or more border regions immediately surrounding a respective ablated region; and depositing inorganic insulating material over the stack at least in the ablated regions and the border regions to cover the ablated regions and make direct contact with said conductor material in said one or more border regions all around the respective ablated region.

According to one embodiment, the method further comprises patterning said deposited inorganic insulating to form islands of said inorganic insulating material, each island extending over a respective ablated region and the border region therearound.

According to one embodiment, said deposited conductor material provides the uppermost conductor layer conductively connected through the stack to the one or more drain electrodes of one or more transistors.

According to one embodiment, the method further comprises providing an optical media component over said stack, wherein said deposited conductor material forms the closest conductor to said optical media component on the same side of the optical media component as said stack.

According to one embodiment, the method further comprises depositing said inorganic insulating material by atomic layer deposition.

According to one embodiment, the deposited inorganic insulating material has a lower water vapour transmission rate than the one or more organic insulating layers.

There is also hereby provided a method comprising: providing a stack of layers defining at least (a) source and drain electrodes, (b) gate electrode, (c) semiconductor channel of at least one transistor, and a continuous layer of inorganic insulating material above at least the at least one semiconductor channel; depositing one or more organic insulating layers over the stack; removing at least part of the stack including at least said one or more organic insulating layers and said inorganic insulating material in one or more selected regions; depositing conductor material over the stack in at least the one or more ablated regions to contact at least all portions of the stack exposed by the removing step below said inorganic insulating layer.

According to one embodiment, said deposited conductor material provides one or more pixel conductors each conductively connected to a respective drain electrode within the stack to control a respective portion of an overlying optical medium.

According to one embodiment, the deposited inorganic insulating material has a lower water vapour transmission rate than the one or more organic insulating layers.

There is also hereby provided a method comprising: providing a stack of layers defining at least one of (a) the source-drain electrodes, (b) gate electrodes, and (c) semiconductor channels of an array of transistors; depositing one or more organic insulating layers over the stack; and depositing a barrier over the one or more organic insulating layers; wherein the barrier comprises (i) one or more patterned layers of conductor material and (ii) a patterned layer of insulator material in at least regions where the one or more patterned layer of conductor material do not overlie the one or more organic insulating layers; and the barrier has a lower water vapour transmission rate than the one or more organic insulating layers both in regions where the patterned layer of conductor material overlies the one or more organic insulating layers and also in regions where the patterned layer of conductor material does not overlie the one or more organic insulating layers.

According to one embodiment, the stack of layers defines all of said source-drain electrodes, gate electrodes and semiconductor channels of the array of transistors, and said one or more patterned layers of conductor material comprises a conductor layer defining an array of pixel conductors for the array of transistors.

According to one embodiment, the stack of layers defines both said source-drain electrodes and said semiconductor channels; and said one or more patterned layers of conductor material comprises a patterned layer defining the gate electrodes for said array of transistors and a patterned layer defining an array of pixel conductors for the array of transistors.

According to one embodiment, depositing the barrier comprises: depositing said insulator material over the one or more organic insulating layers; patterning at least the deposited insulator material and the one or more organic insulating layers to define via holes exposing one or more conductors in the stack; depositing said conductor material over the patterned layers to create a conductor layer in contact with said one or more exposed conductors; and patterning the conductor layer to remove the deposited metal in selected regions and define said array of pixel conductors each in contact with a respective conductor in the stack.

According to one embodiment, depositing the barrier comprises: patterning at least the one or more organic insulating layers to define via holes exposing one or more conductors in the stack; depositing said conductor material over the one or more patterned layers to create a conductor layer in contact with said one or more exposed conductors; patterning the conductor layer to remove the conductor layer in selected regions and define said array of pixel conductors, each in contact with a respective conductor in the stack; depositing said insulator material over the patterned conductor layer; and patterning the layer of insulator material to expose portions of each of said pixel conductors without exposing said one or more organic insulating layers.

According to one embodiment, patterning the layer of insulator material comprises retaining said insulator material over the entire perimeter portion of each pixel conductor.

According to one embodiment, the method further comprises depositing a planarisation layer over the patterned conductor layer and patterning the planarisation layer to expose a portion of each pixel conductor, before depositing said insulator material; and wherein patterning said layer of insulator material comprises not exposing the patterned planarisation layer.

According to one embodiment, the method further comprises depositing a layer of further conductor material over the patterned layer of insulator material for contact with the exposed portions of the pixel conductors; and patterning the deposit of further conductor material so as to form an array of upper pixel conductors, each upper pixel conductor in contact with a respective lower pixel conductor.

According to one embodiment, the method further comprises providing an optical media component over the barrier.

There is also hereby provided a method comprising: providing a stack of layers defining an array of transistors; depositing one or more organic insulating layers over the stack; patterning at least the one or more organic insulating layers by laser ablation to create one or more via holes exposing one or more conductors in the stack; and depositing metal over the patterned layers to create a metal layer in contact with said one or more exposed conductors; patterning the deposited metal to remove the deposited metal in selected regions and define pixel conductors each in contact with a respective conductor in the stack; and depositing an insulator material both in the regions at which said deposited metal was removed and also over the deposited metal in the regions of the via-holes; wherein the deposited insulator material has a low water vapour transmission rate than the substrate directly under said conductors in the stack.

According to one embodiment, the method comprises depositing said insulator material using a deposition technique by which said insulator material is deposited over all regions of the substrate exposed by lifting of the conductors in regions around the via-holes.

There is also hereby provided a device comprising: a stack of layers defining at least one of (a) the source-drain electrodes, (b) gate electrodes, and (c) semiconductor channels of an array of transistors; one or more organic insulating layers over the stack; and a barrier over the one or more organic insulating layers; wherein the barrier comprises (i) one or more patterned layers of conductor material and (ii) a patterned layer of insulator material in at least regions where the one or more patterned layer of conductor material do not overlie the one or more organic insulating layers; and the barrier has a lower water vapour transmission rate than the one or more organic insulating layers both in regions where the patterned layer of conductor material overlies the one or more organic insulating layers and also in regions where the patterned layer of conductor material does not overlie the one or more organic insulating layers.

According to one embodiment, the stack of layers defines all of said source-drain electrodes, gate electrodes and semiconductor channels of the array of transistors, and said one or more patterned layers of conductor material comprises a conductor layer defining an array of pixel conductors for the array of transistors.

According to one embodiment, the stack of layers defines both said source-drain electrodes and said semiconductor channels; and said one or more patterned layers of conductor material comprises a patterned layer defining the gate electrodes for said array of transistors and a patterned layer defining an array of pixel conductors for the array of transistors.

According to one embodiment, said insulator material is formed over the one or more organic insulating layers; the deposited insulator material and the one or more organic insulating layers are patterned to define via holes exposing one or more conductors in the stack; said conductor material is formed over the patterned layers to create a conductor layer in contact with said one or more exposed conductors; and the conductor layer is patterned to define said array of pixel conductors each in contact with a respective conductor in the stack.

According to one embodiment, the one or more organic insulating layers are patterned to define via holes exposing one or more conductors in the stack; said conductor material is formed over the one or more patterned layers to create a conductor layer in contact with said one or more exposed conductors; the conductor layer is patterned to define said array of pixel conductors, each in contact with a respective conductor in the stack; said insulator material is formed over the patterned conductor layer; and the layer of insulator material is patterned to expose portions of each of said pixel conductors without exposing said one or more organic insulating layers.

According to one embodiment, said insulator material is retained over the entire perimeter portion of each pixel conductor.

According to one embodiment, the device further comprises a planarisation layer over the patterned conductor layer and below the layer of insulator material; wherein the planarisation layer is patterned to expose a portion of each pixel conductor, and said layer of insulator material is patterned so as not to expose the patterned planarisation layer.

According to one embodiment, the device further comprises a layer of further conductor material over the patterned layer of insulator material for contact with the exposed portions of the pixel conductors; wherein the layer of further conductor material is patterned so as to form an array of upper pixel conductors, each upper pixel conductor in contact with a respective lower pixel conductor.

According to one embodiment, the device further comprises an optical media component over the barrier.

Embodiments of the present invention are described in detail hereunder, by way of example, with reference to the accompanying drawings, in which.

Embodiments of the present invention are described hereunder for the simple example of a control component comprising a stack of layers defining a single, respective top-gate transistor for each of an array of pixel conductors; but the same technique is also applicable, for example, to control components in which a stack of layers defines a single, respective bottom-gate transistor for each pixel conductor, and to control components in which a stack of layers defines a respective set of two or more transistors for each pixel conductor. Furthermore, the same kind of technique is also applicable to transistor arrays in devices that do not comprise an array of pixel conductors above the transistors, and to transistor arrays in devices other than display devices, such as sensor devices etc.

First Embodiment

Figure 1:
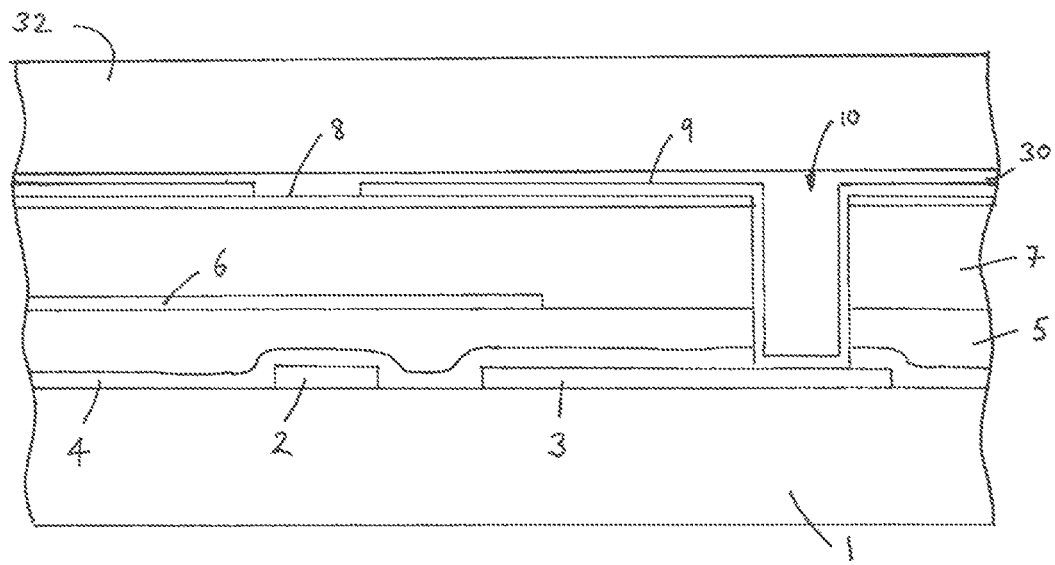
FIG. 1 is a schematic cross-sectional view illustrating a first embodiment of the present invention.
Figure 2:
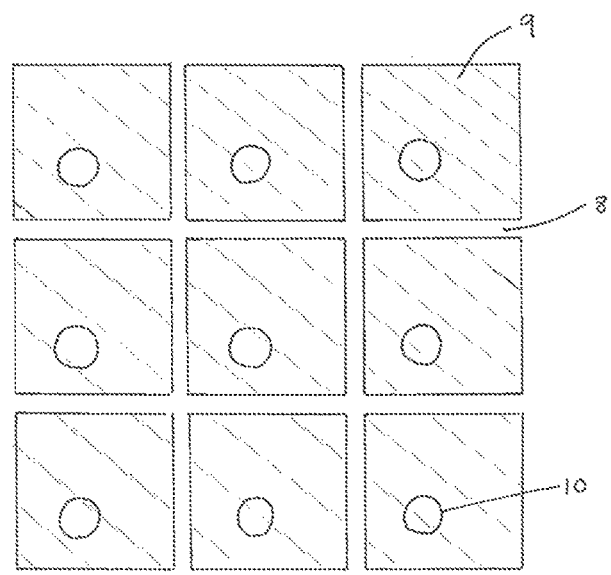
FIG. 2 is a schematic plan view illustrating both the first embodiment of the present invention and also a fourth embodiment of the present invention.

With reference to FIGS. 1 and 2, a technique according to a first embodiment involves forming a stack of conductor, semiconductor and dielectric layers on a support substrate 1 (such as e.g. a flexible, plastic film coated with an organic planarisation layer) so as to define an array of transistors each including source and drain conductors 2, 3 connected by a semiconductor channel provided by a semiconductor layer 4, and a gate conductor 6 capacitively coupled to the semiconductor channel via a gate dielectric layer 5. FIG. 1 only shows the elements for one transistor for one pixel, but a transistor array will typically include a large number of transistors for high resolution display devices. In an active matrix array, the conductor (e.g. metal or conducting polymer) layer defining the source and drain conductors 2, 3 may define a plurality of source conductors each providing the source electrodes for a respective row of transistors and connected to a respective source driver chip terminal, and the conductor (e.g. metal) layer defining the gate conductor 6 may define a plurality of gate conductors each providing the gate conductor for a respective column of transistors and connected to a respective gate driver chip terminal.

Over the stack of layers defining the array of transistors is provided at least one or more organic insulating, passivation layers 7, which prevent shorting between the pixel conductors mentioned later and one or more underlying conductor layers such as the conductor layer defining the gate conductor 6. The one or more organic passivation layers may, for example, include two organic passivation layers separated by a patterned conductor layer designed for achieving good capacitive coupling with the overlying pixel conductors 9.

In this first embodiment, a blanket, non-conducting barrier layer(s) 8 is deposited over the entire area of the uppermost organic passivation layer 7. Examples of suitable materials for the non-conducting barrier layer(s) include (i) inorganic insulating materials such as one or more of silicon nitrides (SiNx), aluminium oxides (AlOx), silicon oxides (SiOx) and aluminium nitride (AlN), TiOx, or a combination of two or more thereof and (ii) cross-linked organic polymers, or a combination thereof. Examples of suitable deposition techniques for the non-conducting barrier layer(s) include: one or more of reactive sputtering, pulsed sputtering, atomic layer deposition (ALD), plasma enhanced atomic layer deposition (PEALD), molecular vapour deposition (MVD), plasma enhanced chemical vapour deposition (PECVD), spatial ALD.

The thickness of the non-conducting barrier layer is preferably no greater than about 200 nm, more preferably no greater than about 50 nm, in order to better prevent undesirable cracking of this layer when the device is flexed, but as mentioned below, it has been found that large decreases in water vapour transmission rate (WVTR) can be achieved with inorganic layers having such small thicknesses.

The non-conducting barrier layer(s) 8, organic passivation layer(s) 7 and one or more layers of the stack defining the transistor array are then patterned to define at least one or more via-holes 10 extending down to respective drain conductors 3 within the stack defining the transistors. Examples of suitable patterning techniques include: laser ablation, photolithography, and plasma etching, or a combination thereof.

A conducting barrier layer(s) 9 is then deposited conformally over the entire area of the patterned non-conducting barrier layer, including those via-hole regions from which the non-conducting barrier layer(s) 8 was removed by patterning. Examples of suitable materials for the conducting barrier layer(s) include metals or conducting compounds such as e.g. conductive titanium nitrides (TiN). Conformal conducting barrier layer(s) may be deposited by sputtering or evaporation. Alternatively, conformal conducting barrier layer(s) may be deposited by ALD, MVD, CVD or electroless or electroplating. The conformal conducting barrier layer may comprise a stack of different metal layers having different properties, such as a lower layer of a metal exhibiting better adhesion to the material of an underlying layer than the metal of an upper layer, and an upper layer exhibiting better electrical conductivity than the lower layer. The conducting barrier layer(s) preferably have a total thickness greater than about 50 nm, but may also have a smaller total thickness.

The conducting barrier layer(s) 9 is then patterned to define an array of pixel conductors, each pixel conductor in contact with a respective drain conductor 3 via a respective via-hole 10. Photolithography, lift-off and laser ablation are examples of techniques for patterning the blanket, conducting barrier layers(s) 9 without causing significant damage to the underlying non-conducting barrier layer(s) 8.

The completed control component is then secured by adhesive 30 to an optical media component 32 whose operation relies on at least some degree of charge injection from the pixel conductors (such as e.g. electrophoretic media or organic light-emitting diodes (OLEDs). The optical media component may include a common, counter electrode on the opposite side of optical media (such as e.g. electrophoretic media) to the pixel conductors 9. Exposure of the pixel conductors (i.e. not being completely covered by an insulating material) may also be important, for example, in sensor devices which rely on direct contact between the pixel conductors and e.g. a fluid to be tested.

The combination of the control component and the optical media component may be encapsulated together by e.g. one or more encapsulation films/layers, but the barrier may nevertheless be useful for protecting e.g. the semiconductor channel and/or source-drain electrodes from degrading species that might originate from the optical media component or an adhesive used to laminate the optical media component to the control component.

Second Embodiment

Figure 3:
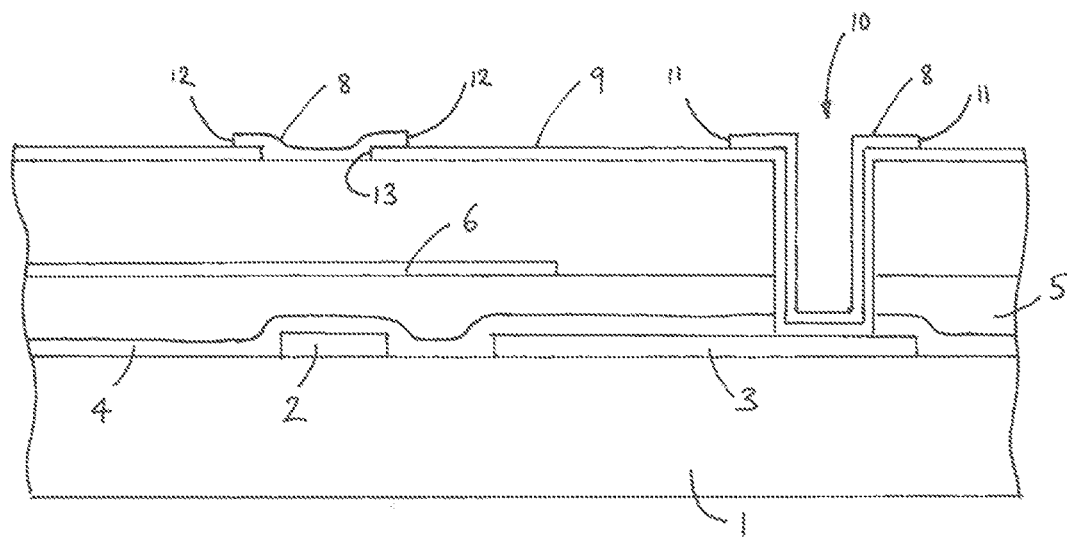
FIG. 3 is a schematic cross-sectional view illustrating a second embodiment of the present invention.
Figure 4:
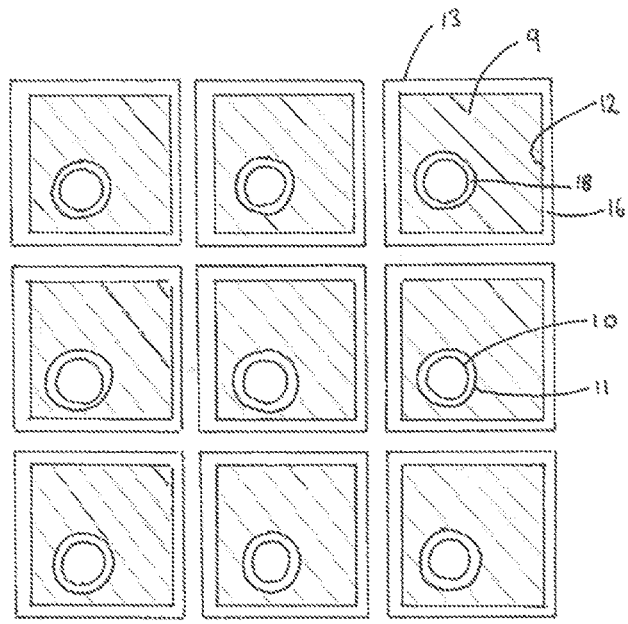
FIG. 4 is a schematic plan view illustrating a second embodiment of the present invention, and also a third embodiment of the present invention.

A second embodiment is illustrated by FIGS. 3 and 4. This second embodiment is the same as the first embodiment up to the step of depositing the one or more organic passivation layers 7.

The organic passivation layer(s) 7 and one or more layers of the stack defining the transistor array are then patterned to define at least one or more via-holes 10 extending down to respective drain conductors 3 within the stack defining the transistors. Examples of suitable patterning techniques include: laser ablation, photolithography using wet etching, and plasma etching, or a combination thereof.

A blanket, conducting barrier layer(s) 9 is deposited conformally over the entire area of the organic passivation layer(s), including those via-hole regions from which the organic passivation layer(s) 7 was removed by patterning. Examples of suitable materials for the conducting barrier layer(s) include metals and conducting compounds such as conductive titanium nitride (TiN). Conformal conducting barrier layer(s) may be deposited by sputtering or evaporation. Alternatively, conformal conducting barrier layer(s) may be deposited by ALD, MVD, CVD or electroless or electroplating.

The conformal conducting barrier layer(s) 9 is then patterned to define an array of pixel conductors, each pixel conductor 9 in contact with a respective drain conductor 3 via a respective via-hole 10.

Photolithography, lift-off and laser ablation are examples of techniques for patterning the blanket, conducting barrier layers(s) 9.

One or more non-conducting barrier materials are then deposited over the entire area of the upper surface of the stack, including in the regions of the vias 10, to form a non-conducting barrier layer(s) 8. The thickness, composition and deposition technique for the non-conducting barrier layer(s) 8 may be the same as described above for the first embodiment.

The non-conducting barrier layer(s) 8 is then patterned to expose a portion of each pixel conductor 9. One example of a suitable patterning technique is photolithography involving patterning a deposit of resist material to form a mask, and etching the non-conducting barrier layer (s) through the resist mask. The patterning is performed such that none of the underlying organic passivation layer(s) 7 is exposed, and more particularly so as to retain the non-conducting barrier layer(s) 8 on the entire perimeter portion 16 of each pixel conductor 9 (such that the non-conducting barrier layer(s) 8 overlaps the whole of the perimeter portions of the pixel conductors 9) and over the entire area of the via-hole regions and a region 18 immediately surrounding the via-holes. In FIGS. 3 and 4, reference numeral 13 indicates the edge of the pixel conductor 9 under the non-conducting barrier layer(s) 8; reference numerals 11 and 12 indicate edges of the patterned non-conducting barrier layer(s) 8; and the hashing in FIG. 4 indicates the exposed portion of the pixel conductors 9.

It has been found that the conformal conducting barrier layer(s) 9 may exhibit pinholes in the areas of the via-holes. The cause of these pinholes is attributed to the roughness of the underlying surface in the regions of via-holes formed by some patterning processes such as laser ablation. It has also been found that forming the via-holes 10 by some patterning processes such as laser ablation can partially or wholly remove the drain conductor 3 in the region of the via-holes 10. For both these reasons, it is effective to retain the non-conducting barrier layer(s) 8 in the region of the via-holes 10.

Figure 7A:
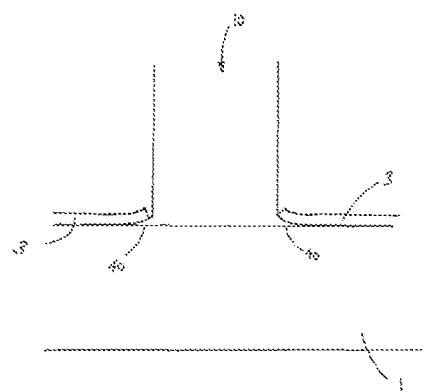
FIG. 7A and 7B illustrates a feature of the second embodiment.
Figure 7B:
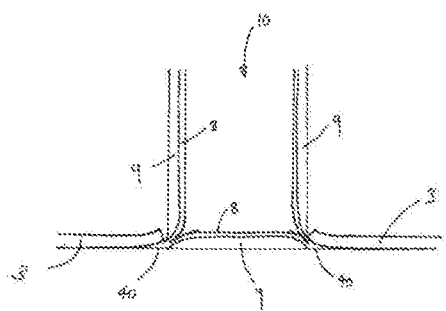

Moreover, with reference to FIG. 7A, it has been found that some patterning processes for forming the via-holes 10 can lead to portions of the drain conductor 6 in regions 40 around the via-hole 10 slightly lifting off the underlying substrate 1 (e.g. planarisation layer on plastic support film) and thereby exposing the underlying substrate 1; and the inventors for the present application have found that atomic layer deposition (ALD) is particularly effective for ensuring deposition of the non-conducting barrier material under these lifted portions of the drain conductor 6 to cover any exposed portions of the underlying substrate 1 in these areas, even when these areas are not covered by the conducting barrier layer 9 (as illustrated by FIG. 7B). This better prevents the ingress of degrading species into the underlying substrate, from which such species might migrate to more sensitive portions of the transistor array.

The completed control component is then secured by adhesive to an optical media component, in the same way as shown in FIG. 1 for the first embodiment.

In one variation of this second embodiment, the non-conducting barrier layer(s) 8 is also removed from over the conducting barrier layer 9 in the region of the vias 10.

Third Embodiment

Figure 5:
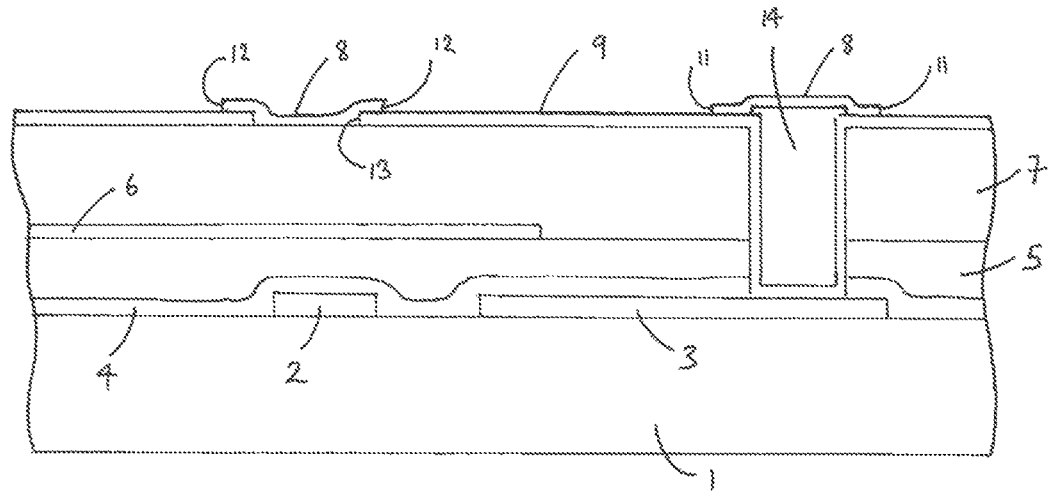
FIG. 5 is a schematic cross-sectional view illustrating a third embodiment of the present invention.

FIG. 5 illustrates a third embodiment. The third embodiment is identical to the second embodiment, except that a planarisation layer 14 is deposited (by e.g. slit coating or spin coating) and patterned so as to expose most of the area of each pixel conductor 9 and provide a flatter surface for the deposition of the non-conducting barrier layer(s) 8 in the via-hole regions 10. This flatter surface facilitates the deposition of a highly conformal non-conducting barrier layer 8 in the next step. One example of a material for the planarisation layer 14 is a resist material whose solubility in a solvent can be changed by irradiation; after irradiation, the planarisation layer 14 is removed everywhere other than in the via-hole regions by exposure of the planarisation layer to said solvent. As mentioned above, some processes for opening via-holes, such as laser ablation, can result in rough surfaces and the uplifting of edge portions of e.g. the drain conductor 3 at the bottom of the via-hole 10 leaving small gaps between these edge portions of the drain conductor and the underlying substrate. The use of a planarisation layer 14 over the conducting barrier layer 9 can make it possible to use a less highly conformal deposition process for the deposition of the non-conducting barrier material 8.

The plan view of the finished control component is the same as that of the second embodiment as illustrated by FIG. 4.

The completed control component is then secured by adhesive to an optical media component, in the same way as shown in FIG. 1 for the first embodiment.

In one variation of the techniques illustrated in FIGS. 3 to 5, the non-conducting barrier layer 8 is not patterned, and the optical media component 32 is an electrophoretic media component. The inventors for the present application have found that the small amount of charge carrier injection required for a bistable electrophoretic media component is achievable even when the drive circuit includes a thin non-conducting barrier layer 8. The retention of the non-conducting barrier layer over the whole area of the pixel electrodes 9 is also possible with a liquid crystal display (LCD) optical medium.

Fourth Embodiment

Figure 6:
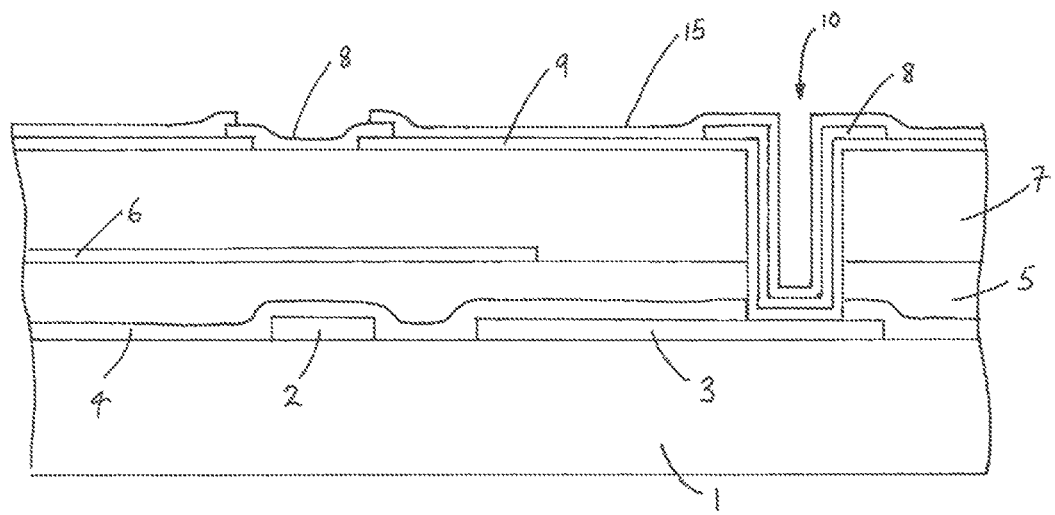
FIG. 6 is a schematic cross-sectional view illustrating a fourth embodiment of the present invention.

A fourth embodiment is illustrated in FIG. 6. The fourth embodiment is identical to the second embodiment except that a further conductor layer 15 is deposited over the entire area of the patterned non-conducting barrier layer(s) 8, including the regions in which the non-conducting barrier layer does not overlie the pixel conductors 9, and then patterned to form a second array of pixel conductors each in contact with a respective one of the underlying array of pixel conductors 9. This same technique can be used as an addition to the third embodiment. In either case, the plan view of the resulting control component is substantially the same as that of the first embodiment, as illustrated by FIG. 2.

Providing a further conductor layer 15 over the non-conducting barrier layer 8 and conducting barrier layer 9 can improve the protection of e.g. the semiconductor channel and source-drain electrodes against moisture or other degrading species, and also increase the area of the pixel conductors.

The completed control component is then secured by adhesive to an optical media component, in the same was as shown in FIG. 1 for the first embodiment.

Fifth Embodiment

Figure 8:
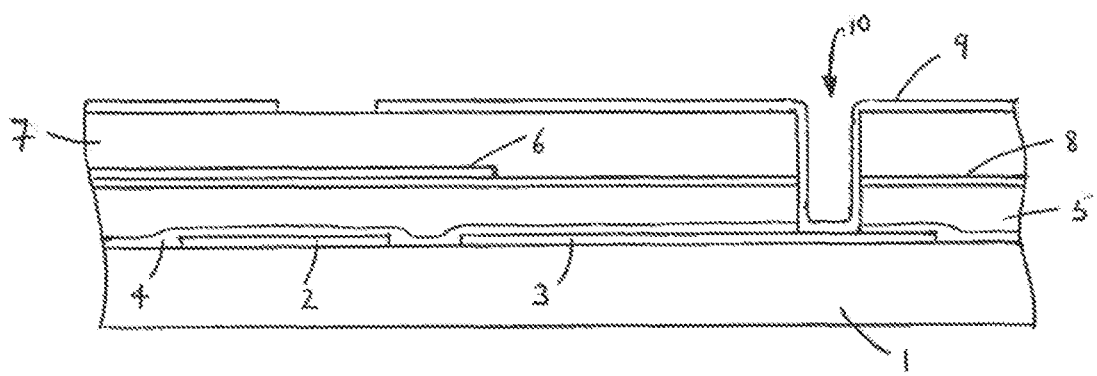
FIG. 8 is a schematic cross-sectional view illustrating a fifth embodiment of the present invention.

A fifth embodiment is illustrated in FIG. 8. This fifth embodiment is identical to the first embodiment except that the non-conducting barrier layer 8 is instead formed over the gate dielectric 5 comprising one or more organic insulating layers and directly beneath the patterned conductor layer defining the gate conductors 6. The non-conducting barrier layer 8 is deposited over the entire area of the gate dielectric 5 and is patterned together with the gate dielectric (and the semiconductor layer 4) when forming the vias 10 down through the passivation layer(s) 7, gate dielectric 5 and semiconductor layer 4. The non-conducting barrier 8 is thus present in all regions in which neither conductor layer 6 nor conductor layer 9 directly overlie the gate dielectric 5; and the combination of the non-conducting barrier layer 8 and the two conductor layers 6, 9 provide effective protection for the semiconductor channel and source-drain electrodes against moisture or degrading species. According to one variation of this fifth embodiment, the non-conducting barrier layer is formed directly over the patterned conductor layer that defines the gate conductors 6. Again, the non-conducting barrier 8 is thus present in all regions in which neither conductor layer 6 nor conductor layer 9 directly overlie the gate dielectric 5.

The completed control component is then secured by adhesive to an optical media component, in the same was as shown in FIG. 1 for the first embodiment.

In each of the above-described embodiments, both the conducting and non-conducting barrier layers 8, 9 exhibit a lower water vapour transmission rate (WVTR) under the same conditions (e.g. humidity, temperature) than the underlying organic passivation/dielectric layer(s) 5, 7, so that e.g. semiconductor channel and source-drain electrodes are better protected against the ingress of degrading chemical species in all regions, including the regions between the pixel conductors where the conducting part of the barrier layer(s) does not overlie the organic passivation/dielectric layer(s). For example, the addition of 25 nm and 50 nm layers of AlOx/TiOx deposited by ALD were found to reduce the WVTR of an organic layer stack by a factor of between about 100 and 1000. The addition of a conducting metal layer deposited by DC sputtering was found to reduce the WVTR of an organic layer stack by a factor of between about 1000 and 10000.

The techniques according to each of the above-described embodiments provide good moisture protection via one or more patterned conductor layers, without leaving any gaps in the protection or the e.g. semiconductor channel and source-drain electrodes against moisture, whilst achieving good isolation (avoidance of shorts) between individual elements of the patterned conductor layer. In the embodiments of FIGS. 1 to 7, these advantages are achieved whilst leaving the pixel conductors exposed for e.g. achieving a good ohmic contact with an outside element such as a display medium requiring the injection of charge from the pixel conductors, or for contact with a species in the case of a sensor device.

The above-described techniques are not limited to the use of any specific materials for e.g. the source-drain electrodes, semiconductor, gate dielectric and passivation layers. However, examples of materials for the source-drain electrode are metal layers or stacks of two or more metal sub-layers; examples of materials for the semiconductor are organic conjugated semiconducting polymers; and examples of materials for the gate dielectric and passivation layers are organic polymers.

In addition to any modifications explicitly mentioned above, it will be evident to a person skilled in the art that various other modifications of the described embodiments may be made within the scope of the invention.

The invention claimed is:

1. A method comprising:
providing a stack of layers defining at least (a) source and drain electrodes, (b) gate electrode, and (c) semiconductor channel of at least one transistor;
depositing one or more organic insulating layers over the stack;
removing at least part of the stack in one or more selected regions by an ablation technique to form one or more ablated regions;
depositing conductor material over the stack in at least the one or more ablated regions and one or more border regions immediately surrounding a respective ablated region; and
depositing inorganic insulating material over the stack at least in the ablated regions and the border regions to cover the ablated regions and make direct contact with said conductor material in said one or more border regions all around the respective ablated region;
wherein the method comprises providing an optical media component over said stack, and
wherein said optical media component extends continuously over the inorganic insulating material in the ablated regions and said one or more border regions.

2. A method according to claim 1, comprising patterning said deposited inorganic insulating to form islands of said inorganic insulating material, each island extending over a respective ablated region and the border region therearound.

3. A method according to claim 1, wherein said deposited conductor material provides the uppermost conductor layer conductively connected through the stack to the one or more drain electrodes of one or more transistors.

4. A method according to claim 1, wherein said deposited conductor material forms a closest conductor to said optical media component on a same side of the optical media component as said stack.

5. A method according to claim 1, comprising depositing said inorganic insulating material by atomic layer deposition.

6. A method according to claim 1, wherein the deposited inorganic insulating material has a lower water vapour transmission rate than the one or more organic insulating layers.

7. The method according to claim 1, wherein said deposited conductor material provides an array of pixel electrodes under the optical media component, and
wherein said inorganic insulating material is retained over the whole array of the pixel electrodes between said pixel electrodes and the optical media component.

8. The method according to claim 1, wherein providing the optical media component comprises securing a liquid crystal display media component, or an electrophoretic media component over the stack by adhesive.

9. A method comprising:
providing a stack of layers defining at least (a) source and drain electrodes, (b) gate electrode, (c) semiconductor channel of at least one transistor, and a continuous layer of inorganic insulating material between the semiconductor channel and the gate electrode;
depositing one or more organic insulating layers over the stack;
removing at least part of the stack including at least said one or more organic insulating layers and said inorganic insulating material in one or more selected regions; and
depositing conductor material over the stack in at least the one or more selected regions to contact at least all portions of the stack exposed by the removing step below said inorganic insulating layer.

10. A method according to claim 9, wherein said deposited conductor material provides one or more pixel conductors each conductively connected to a respective drain electrode within the stack to control a respective portion of an overlying optical medium.

11. A method according to claim 9, wherein the deposited inorganic insulating material has a lower water vapour transmission rate than the one or more organic insulating layers.

12. A method comprising:
providing a stack of layers defining at least one of (a) the source-drain electrodes, (b) gate electrodes, and (c) semiconductor channels of an array of transistors;
depositing one or more organic insulating layers over the stack; and
depositing a barrier over the one or more organic insulating layers;
wherein the barrier comprises (i) one or more patterned layers of conductor material and (ii) a patterned layer of insulator material in at least regions where the one or more patterned layer of conductor material do not overlie the one or more organic insulating layers; and
wherein the barrier has a lower water vapour transmission rate than the one or more organic insulating layers both in regions where the patterned layer of conductor material overlies the one or more organic insulating layers and also in regions where the patterned layer of conductor material does not overlie the one or more organic insulating layers.

13. A method according to claim 12, wherein the stack of layers defines all of said source-drain electrodes, gate electrodes and semiconductor channels of the array of transistors, and wherein said one or more patterned layers of conductor material comprises a conductor layer defining an array of pixel conductors for the array of transistors.

14. A method according to claim 13, wherein depositing the barrier comprises: depositing said insulator material over the one or more organic insulating layers; patterning at least the deposited insulator material and the one or more organic insulating layers to define via holes exposing one or more conductors in the stack; depositing said conductor material over the patterned layers to create a conductor layer in contact with said one or more exposed conductors; and patterning the conductor layer to remove the deposited metal in selected regions and define said array of pixel conductors each in contact with a respective conductor in the stack.

15. A method according to claim 13, wherein depositing the barrier comprises: patterning at least the one or more organic insulating layers to define via holes exposing one or more conductors in the stack; depositing said conductor material over the one or more patterned layers to create a conductor layer in contact with said one or more exposed conductors; patterning the conductor layer to remove the conductor layer in selected regions and define said array of pixel conductors, each in contact with a respective conductor in the stack; depositing said insulator material over the patterned conductor layer; and patterning the layer of insulator material to expose portions of each of said pixel conductors without exposing said one or more organic insulating layers.

16. A method according to claim 15, wherein patterning the layer of insulator material comprises retaining said insulator material over the entire perimeter portion of each pixel conductor.

17. A method according to claim 16, further comprising depositing a layer of further conductor material over the patterned layer of insulator material for contact with the exposed portions of the pixel conductors; and patterning the deposit of further conductor material so as to form an array of upper pixel conductors, each upper pixel conductor in contact with a respective lower pixel conductor.

18. A method according to claim 15, further comprising depositing a planarisation layer over the patterned conductor layer and patterning the planarisation layer to expose a portion of each pixel conductor, before depositing said insulator material; and wherein patterning said layer of insulator material comprises not exposing the patterned planarisation layer.

19. A method according to claim 12, wherein the stack of layers defines both said source-drain electrodes and said semiconductor channels; and wherein said one or more patterned layers of conductor material comprises a patterned layer defining the gate electrodes for said array of transistors and a patterned layer defining an array of pixel conductors for the array of transistors.

20. A method according to claim 12 comprising providing an optical media component over the barrier.

* * * * *